(12) United States Patent
Chen et al.

(10) Patent No.: US 6,380,069 B1
(45) Date of Patent: Apr. 30, 2002

(54) METHOD OF REMOVING MICRO-SCRATCH ON METAL LAYER

(75) Inventors: Hsueh-Chung Chen, Yung-Ho; Yung-Tsung Wei, Tainan; Ming-Sheng Yang, Hsin-Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/483,581

(22) Filed: Jan. 14, 2000

(51) Int. Cl.$^7$ ............................................. H01L 21/4763
(52) U.S. Cl. ..................... 438/633; 438/672; 438/692
(58) Field of Search ................................ 438/633, 672, 438/692

(56) References Cited

U.S. PATENT DOCUMENTS 6,117,783 A * 9/2000 Small et al. ................. 438/692
6,153,526 A * 11/2000 Shih et al. ................... 438/692

* cited by examiner

Primary Examiner—John F. Niebling
Assistant Examiner—Lynne A. Gurley
(74) Attorney, Agent, or Firm—Powell, Goldstein, Frazer & Murphy, LLP

(57) ABSTRACT

A method of removing the micro-scratches on a metal layer is described, wherein the metal layer is formed on a barrier layer conformally onto a dielectric layer having a hole thereon, and wherein the metal layer over-fills the hole. The method comprises three chemical-mechanical polishing steps as described hereinbelow. The first chemical-mechanical polishing step is that oxidizing and polishing away the metal layer outside the hole, with a first slurry, wherein the first slurry has a chemical solution and has a plurality of abrasive particles. The second chemical-mechanical polishing step is that polishing away the barrier layer outside the hole, with a second slurry, whereby a plurality of micro-scratches are formed on the metal layer after the barrier layer is chemical-mechanically polished. The third chemical-mechanical polishing step is that buffing the metal layer, with the first slurry, thereby removing the micro-scratches on the metal layer.

18 Claims, 3 Drawing Sheets

METHOD OF REMOVING MICRO-SCRATCH ON METAL LAYER

BACKGROUND OF THE INVENTION

1. Field of the Invention

The present invention relates to a metal-polishing method, and particularly to a method of removing micro-scratches on a metal layer.

2. Description of the Prior Art

In semiconductor technology, metal layers are applied to wire various components formed on a semiconductor wafer. The metal wiring process includes patterning and etching a hole within a thick layer of dielectric layer. Thereafter, a conformal barrier layer, such as Ti, TiW or TiN layer, is provided on the dielectric layer and within the hole. The conformal barrier layer functions to separate the dielectric layer from a metal layer deposited subsequently. After barrier layer deposition, a metal layer is deposited to over-fill the hole. The hole created prior to the metal deposition defines a metal pattern, so that a desired wire line will be formed after a planarizing technique removes the metal layer outside the hole.

Chemical mechanical polishing (CMP), an example of the above planarizing technique, uses apparatus similar to a grinder wheel along with a reagent to mechanically grind off the uneven profile of a semiconductor wafer. When the CMP is applied to form metal lines by the metal wiring process described above, it is referred to as a damascene process.

The reagent is usually referred to as "slurry". Slurry is a solution mixed with chemicals and abrasive particles. The abrasive particles are extremely hard and have a diameter of about 0.1–0.5 micrometers.

During polishing by a CMP apparatus, the abrasive particles with large size are filtered by a filter in order to reduce the micro-scratches on the metal surface. However, particles with small size are easily agglomerated into a large size particle. Moreover, while the polishing process stops, even the large size particles deposit. Those large size particles scrape the metal surface and leave micro-scratches thereon, thereby decreasing the yield of the damascene process. Accordingly, we need a method of removing the micro-scratches on a metal surface.

SUMMARY OF THE INVENTION

It is an object of this invention to provide a method of removing the micro-scratches on a metal surface.

Other objects and advantages of this invention will become apparent to those of ordinary skill in the art having reference to the following specification in conjunction the drawings.

The invention may be incorporated into a method of removing the micro-scratches on a metal layer, wherein the metal layer is formed on a barrier layer conforming onto a dielectric layer having a hole thereon, and wherein the metal layer over-fills the hole. The metal layer is chemical-mechanically polished, to oxidize and polish away the metal layer outside the hole, with a first slurry, wherein the slurry has a chemical solution and has a plurality of abrasive particles. The barrier layer is chemical-mechanically polished to oxidize and polish away the barrier layer outside the hole with a second slurry, whereby micro-scratches are formed on the metal layer. The metal layer is chemical-mechanically polished again, to buff the metal layer, with the first slurry, thereby removing the micro-scratches on the metal layer.

The metal layer is preferably buffed for about 1 to about 30 seconds with the slurry. Moreover, the buffing slurry has a preferable chemical concentration less than that of the slurry used for oxidizing and polishing away the metal layer outside the hole. The chemical concentration is lowered for slowing down the buffing removal rate. However, alternatively, the buffing removal rate can also be slowed down by reducing the number of the abrasive particles from the slurry. Another method of slowing down the polishing removal rate is to adjust the parameters of the CMP apparatus.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Figure 1:
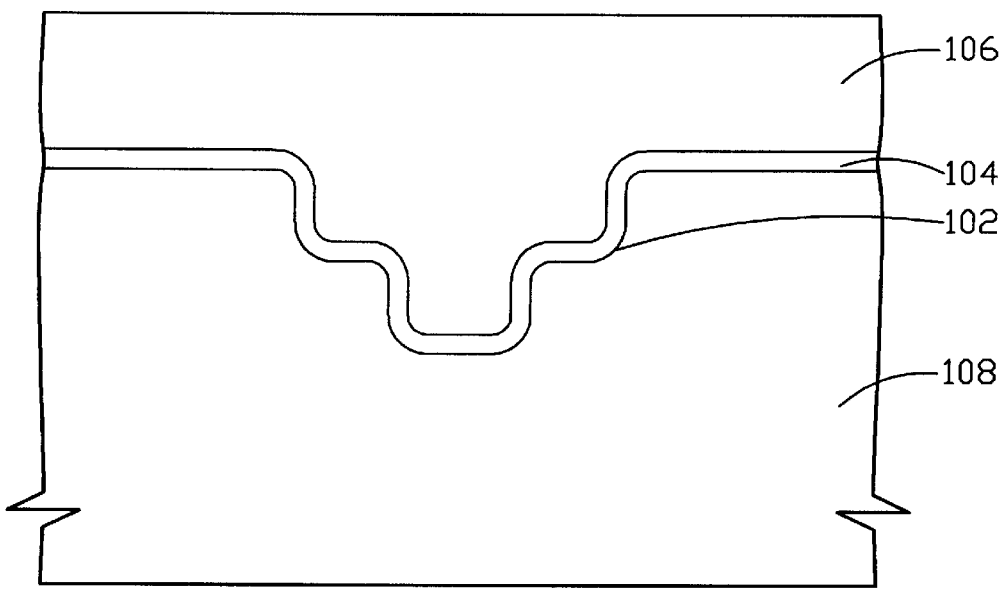
FIG. 1 is a schematic, cross-sectional view showing a dual-damascene structure.

FIG. 1 is a schematic, cross-sectional view showing a dual-damascene structure. In this structure, a barrier layer 104 and a metal layer 106 are sequentially formed in and on a dielectric (e.g. oxide) layer 108, wherein the barrier layer 104 conforms onto the dielectric layer 108 having a hole 102 thereon, and wherein the metal layer 106 over-fills the hole 102 on the dielectric layer 108.

Figure 2:
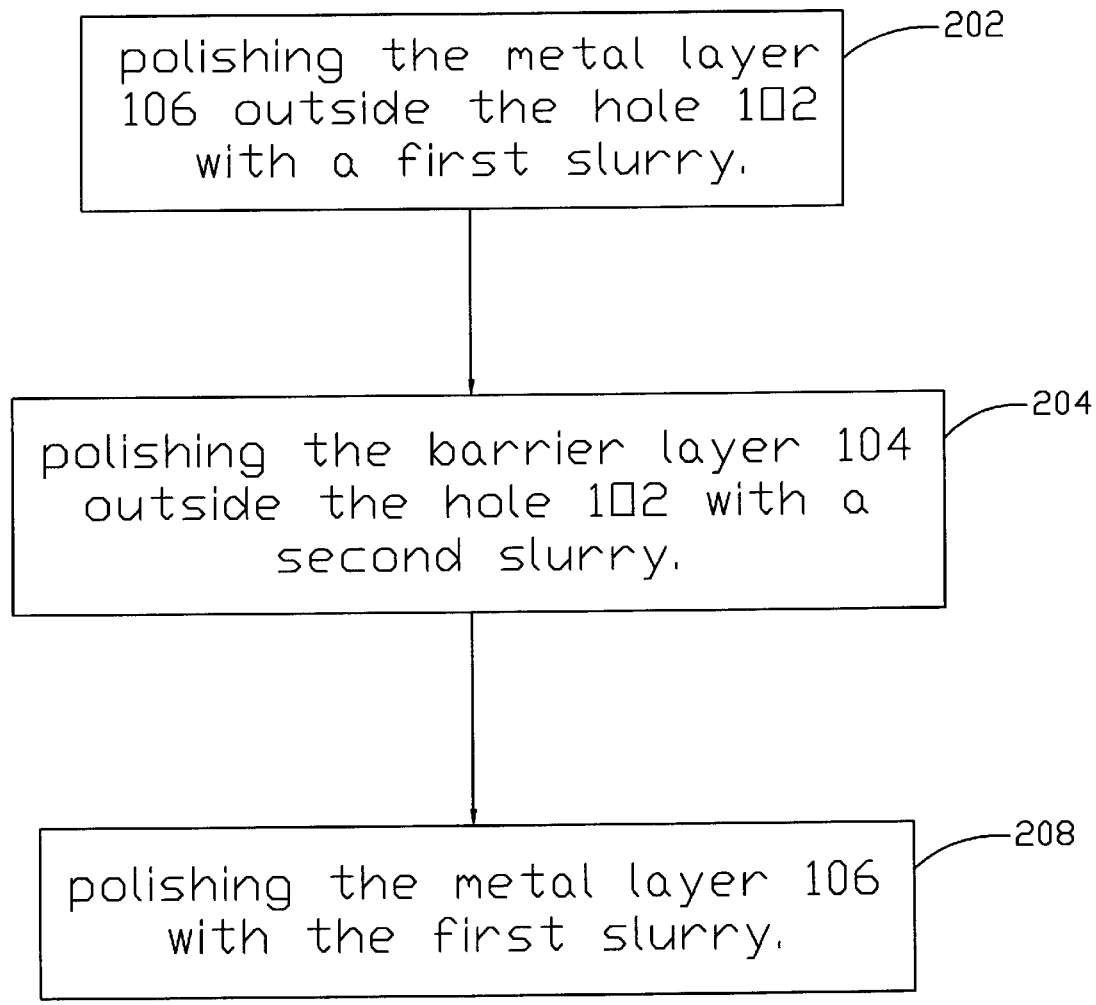
FIG. 2 is a flow chart illustrating a metal CMP process according to one preferred embodiment of this invention.

FIG. 2 is a flow chart illustrating a metal CMP process according to one preferred embodiment of this invention. Referring to FIG. 2 and FIG. 1, this metal CMP process involves a first polishing step 202 that removes the metal layer 106 outside the hole 102, and involves a second polishing step 204 that removes the barrier layer 104 outside the hole 102. Feasibly, the metal CMP process can involve a one-step process that accomplishes both metal and liner removal.

In the first polishing step 202, a first slurry oxidizes the metal layer 106 outside the hole 102 while the applied mechanical force along with friction polishes away the oxidized metal. After the oxidized metal is polished away from the filed regions, a second slurry is introduced that removes the barrier layer 104 (e.g. Ti and TiN) outside the hole 102. This second polishing step 204 continues until the dielectric layer 108 is slightly eroded, to ensure that the field regions are cleaned of all residual metal.

Still referring to FIG. 2 and FIG. 1, the metal CMP process further involves a buffing step (a third polishing step) 208 oxidizing and polishing away a thin thickness of the first-polished metal layer 106 on the surface by using the first slurry. The buffing step 208 removes the micro-scratches that can increase the yield of the dual damascene processing. Verified by experiments, applying this buffing step 208 on an 8 inches wafer reduces the number of the defects from about several hundreds to about less than one hundred. At the same time, the micro-scratches on the metal layer 106 are also removed by this buffing step 208.

However, this buffing step 208 increases polishing time and also increases the line resistance, since the effect cross-sectional area of the metal portion 106 of the interconnect line is reduced by a combination of metal dishing and dielectric erosion. Hence, the time of the buffing step 208 should be very short, and is preferably performed for about 1 to about 30 seconds. In other words, about 1–30 seconds are enough to remove the micro-scratches, since the micro-scratches are relatively much shallower than the hole 102.

Because the micro-scratches are very shallow and have an average depth of only about several nanometers, the first slurry to the metal buffing step 208 preferably has a chemical concentration lower than that to the first polishing step 202, for slowing down the metal-buffing rate. Alternatively, the abrasive particles from the first slurry to the metal buffing step 208 have a number less than that to the first polishing step 202. Such first slurry to the metal buffing step 208 has a preferable abrasive-particle concentration of about 0–50%, and most preferably of about 10%. The concentration decrease or the abrasive-particle reduction facilitates the control of the metal buffing step 208.

Another alternative method of slowing down the buffing removal rate is to adjust the parameters of the CMP apparatus. If the metal layer is chemical-mechanically polished away, and is also buffed by the same chemical mechanical polishing (CMP) apparatus having a plurality of parameters for operation, we can adjust the parameters to slow down the buffing removal rate. The buffing removal rate is conditioned to be slower than the rate of the first polishing step 202.

Figure 3:
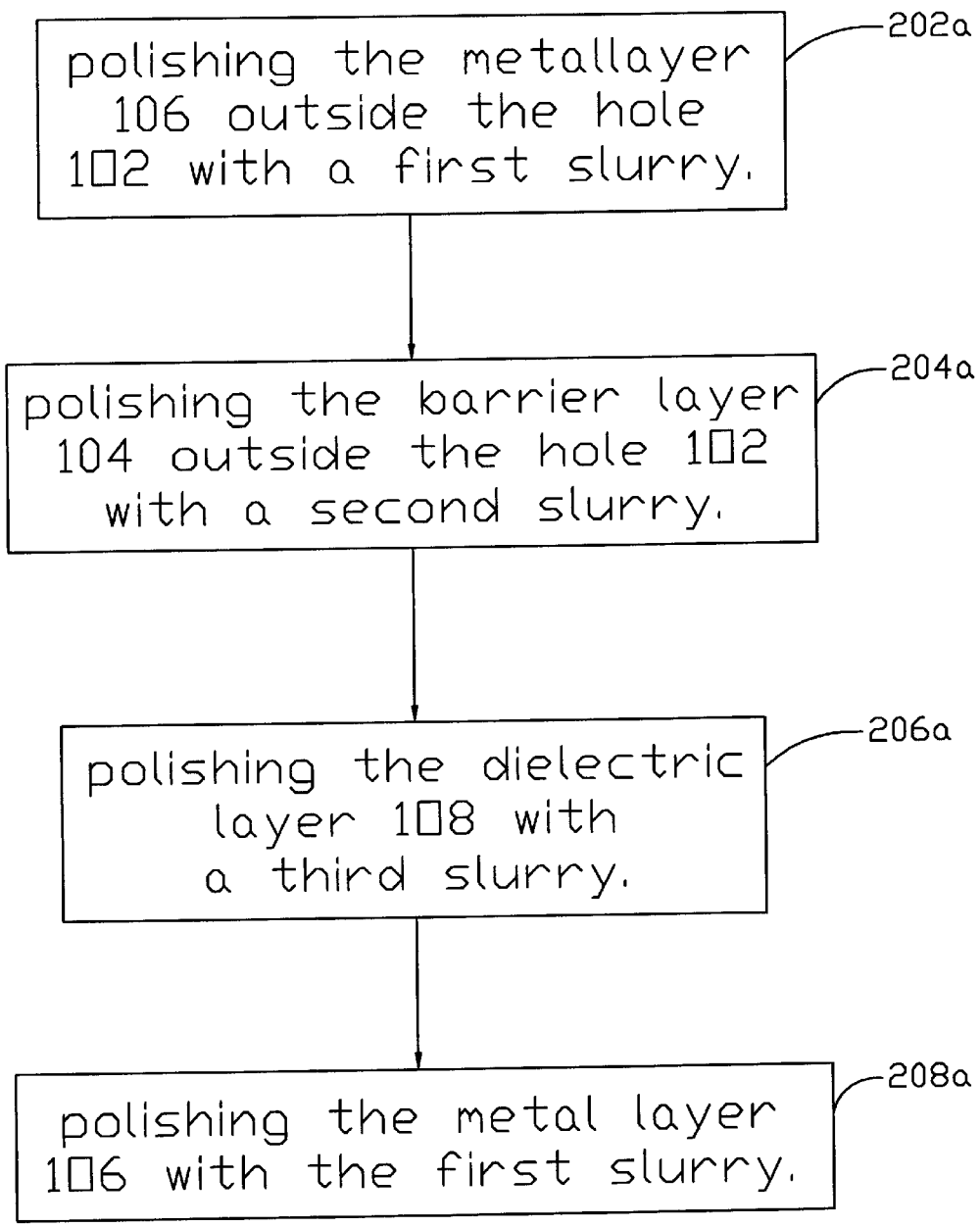
FIG. 3 is another flow chart illustrating a metal CMP process according to one preferred embodiment of this invention.

Before the metal layer 106 is buffed and after the first and the second polishing steps 202, 204, another polishing step may be needed for buffing of the dielectric layer. As shown in FIG. 3, which is another flow chart illustrating a metal CMP process according to another preferred embodiment of this invention. In this flow chart, the additional polishing step 206 buffs the dielectric surface 108 with a third slurry. The steps 202a, 204a, 208a are substantially the same as the steps 202, 204, 208 of FIG. 2.

Although specific embodiments have been illustrated and described, it will be obvious to those skilled in the art that various modifications may be made without departing from the spirit which is intended to be limited solely by the appended claims. For example, the hole described above is not limited to be a dual-damascene hole. Various modifications and variations of the hole can be made to a contact hole, via hole, or other type of hole without departing from the scope or spirit of the invention.

What is claimed is:

1. A method of removing the micro-scratches on a metal layer, wherein the metal layer is formed on a barrier layer conformally onto a dielectric layer having a hole thereon, and wherein the metal layer over-fills the hole, which method comprises:

chemical-mechanically polishing the metal layer, to oxidize and polish away the metal layer outside the hole, with a first slurry, wherein the slurry has a chemical solution and has a plurality of abrasive particles;

chemical-mechanically polishing the barrier layer to oxidize and polish away the barrier layer outside the hole with a second slurry; and chemical-mechanically polishing the metal layer, to buff the metal layer, with the first slurry.

2. The method according to claim 1, wherein the metal layer is buffed for about 3 to about 20 seconds.

3. The method according to claim 1, wherein the slurry used for buffing the metal layer has a chemical concentration less than that of the slurry used for oxidizing and polishing away the metal layer outside the hole.

4. The method according to claim 1, wherein the abrasive particles from the slurry to buff the metal layer have a number less than that to polish away the metal layer outside the hole.

5. The method according to claim 1, wherein the method according to claim, wherein the slurry to buff the metal layer has a abrasive-particle concentration less than about 50%.

6. The method according to claim 5, wherein the method according to claim, wherein the slurry to buff the metal layer have a abrasive-particle concentration of about 10%.

7. The method according to claim 1, wherein the metal layer is chemical-mechanically polished by a chemical mechanical polishing (CMP) apparatus having a plurality of parameters for operation, and wherein the parameters can be adjusted to slow down the buffing removal rate.

8. The method according to claim 7, further comprises adjusting the parameters to slow down the buffing removal rate, so that the buffing removal rate is slower than the rate of oxidizing and polishing away the metal layer outside the hole.

9. The method according to claim 1, further comprises chemical-mechanically polishing the dielectric layer, to buff the dielectric layer, before the metal layer is buffed and after the barrier layer is oxidized and polished away.

10. A process for chemical-mechanically polishing a metal layer and a barrier layer in dual-damascene metal processing, wherein the barrier layer conformally formed onto a dielectric layer having a hole thereon, and wherein the metal layer is formed on the barrier layer to over-fill the hole, which process comprises:

chemical-mechanically polishing the metal layer, to oxidize and polish away the metal layer outside the hole, with a first slurry, wherein the first slurry has a chemical solution and has a plurality of abrasive particles;

chemical-mechanically polishing the barrier layer, to polish away the barrier layer outside the hole, with a second slurry; and chemical-mechanically polishing the metal layer, to buff the metal layer, with the first slurry.

11. The process according to claim 10, wherein the metal layer is buffed for about 1 to about 30 seconds.

12. The process according to claim 10, wherein the first slurry used for buffing the metal layer has a chemical concentration less than that of the first slurry used for polishing away the metal layer outside the hole.

13. The process according to claim 10, wherein the abrasive particles from the first slurry to buff the metal layer have a number less than that to polish away the metal layer outside the hole.

14. The process according to claim 10, wherein the first slurry to buff the metal layer has a abrasive-particle concentration less than about 50%.

15. The process according to claim 14, wherein the first slurry to buff the metal layer have a abrasive-particle concentration of about 10%.

16. The process according to claim 10, wherein the metal layer is chemical-mechanically polished by the same chemical mechanical polishing (CMP) apparatus having a plurality of parameters for operation, and wherein the parameters can be adjusted to slow down the buffing rate.

17. The process according to claim 16, further comprises adjusting the parameters to slow down the buffing removal rate, so that the buffing removal rate is slower than the rate of polishing away the metal layer outside the hole.

18. The process according to claim 10, further comprises chemical-mechanically polishing the dielectric layer, to buff the dielectric layer, with a third slurry, before the metal layer is buffed and after the barrier layer is oxidized and polished away.

* * * * *